(12) United States Patent
Oshima

(10) Patent No.: US 8,143,702 B2
(45) Date of Patent: Mar. 27, 2012

(54) GROUP III-V NITRIDE BASED SEMICONDUCTOR SUBSTRATE AND METHOD OF MAKING SAME

(75) Inventor: Yuichi Oshima, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 12/662,461

(22) Filed: Apr. 19, 2010

(65) Prior Publication Data
US 2010/0200955 A1 Aug. 12, 2010

Related U.S. Application Data

(63) Continuation of application No. 11/176,687, filed on Jul. 8, 2005, now abandoned.

(30) Foreign Application Priority Data

Apr. 11, 2005 (JP) .................. 2005-113416

(51) Int. Cl.
*H01L 29/20* (2006.01)

(52) U.S. Cl. .......... 257/615; 257/618; 257/627

(58) Field of Classification Search .......... None
See application file for complete search history.

(56) References Cited

U.S. PATENT DOCUMENTS

| | | | |
|---|---|---|---|
| 5,122,845 A | 6/1992 | Manabe et al. | |
| 5,290,393 A | 3/1994 | Nakamura | |
| 6,468,347 B1 | 10/2002 | Motoki et al. | |
| 6,488,767 B1 | 12/2002 | Xu et al. | |
| 7,057,204 B2 | 6/2006 | Shibata | |
| 7,182,974 B2 | 2/2007 | Takahashi et al. | |
| 7,253,499 B2 | 8/2007 | Shibata | |
| 7,276,779 B2 | 10/2007 | Shibata | |
| 7,323,256 B2 | 1/2008 | Xu et al. | |
| 7,348,278 B2 | 3/2008 | Oshima | |
| 2002/0189532 A1 | 12/2002 | Motoki et al. | |
| 2002/0197825 A1 | 12/2002 | Usui et al. | |
| 2003/0099866 A1 | 5/2003 | Takahashi et al. | |
| 2004/0147096 A1 | 7/2004 | Kitaoka et al. | |
| 2004/0157083 A1 | 8/2004 | Takahashi et al. | |
| 2005/0023544 A1 | 2/2005 | Shibata | |
| 2005/0093003 A1 | 5/2005 | Shibata | |
| 2005/0103257 A1 | 5/2005 | Xu et al. | |
| 2005/0274975 A1 | 12/2005 | Shibata | |
| 2006/0046325 A1 | 3/2006 | Usui et al. | |

(Continued)

FOREIGN PATENT DOCUMENTS

JP 02192722 A 7/1990

(Continued)

OTHER PUBLICATIONS

Notification of Reason(s) for Refusal (JPO) dated Nov. 11, 2010, with English translation.

(Continued)

*Primary Examiner* — David E Graybill
(74) *Attorney, Agent, or Firm* — McGinn IP Law Group, PLLC

(57) ABSTRACT

A group III-V nitride-based semiconductor substrate includes a group III-V nitride-based semiconductor crystal. A surface area of the substrate is greater than or equal to 45 cm$^2$. A thickness of the substrate is greater than or equal to 200 μm. An in-plane dislocation density of the substrate is less than or equal to 2×10$^7$ cm$^{-2}$ in average. The in-plane dislocation density of the substrate is less than or equal to 150% of the average at maximum.

17 Claims, 9 Drawing Sheets

Dispersion of Carrier concentration = (3.0±0.2)×10$^{18}$ cm$^{-3}$
Average Dislocation density = 5×10$^5$ cm$^{-2}$
Dislocation density dispersion (in-plane distribution) = (5±0.2)×10$^5$ cm$^{-2}$
Carrier concentration at arbitrary point = ±20% of average carrier concentration at surface
Thickness at arbitrary point of surface = ±10 μm of average thickness at surface Surface area ≥ 45 cm$^2$

10

Dispersion in crystal axis is ± 0.3 degrees

Diameter ≥ 3 inches

Thickness ≥ 200 μm

U.S. PATENT DOCUMENTS

| | | |
|---|---|---|
| 2006/0226414 A1 | 10/2006 | Oshima |
| 2006/0228819 A1 | 10/2006 | Oshima |
| 2006/0272572 A1 | 12/2006 | Uematsu et al. |
| 2008/0003786 A1 | 1/2008 | Xu et al. |
| 2008/0124510 A1 | 5/2008 | Xu et al. |

FOREIGN PATENT DOCUMENTS

| | | |
|---|---|---|
| JP | 8-8217 | 1/1996 |
| JP | 8-139028 A | 5/1996 |
| JP | 2751963 | 2/1998 |
| JP | 3026087 | 1/2000 |
| JP | 2003-165798 A | 6/2003 |
| JP | 2003-178984 | 6/2003 |
| JP | 2004-39810 A | 2/2004 |

OTHER PUBLICATIONS

Yuichi Oshima, et al., "Fabrication of Freestanding GaN Wafers by Hydride Vapor Phase Epitaxy with Void-Assisted Separation", Proceedings of the 63rd Meeting of the Japan Society of Applied Physics and Related Societies, 2002, vol. 63, No. 1, p. 311; with partial English translation.

Partial translationa of Masatomo Shibata, et al., "Mechanism of Dislocation Reduction in Freestanding GaN Wafers by Hydride Vapor Phase Epitaxy with Void-Assisted Separation", Proceedings of the 63rd Meeting of the Japan Society of Applied Physics and Related Societies, 2002, vol. 63, No. 1, p. 312; with partial English translation.

6 SAPPHIRE SUBSTRATE

7 GaN UNDERLYING LAYER (MOVPE)
6 SAPPHIRE SUBSTRATE

8 GaN THICK FILM
6 SAPPHIRE SUBSTRATE

9 GaN SUBSTRATE

10 GaN SELF-STANDING SUBSTRATE

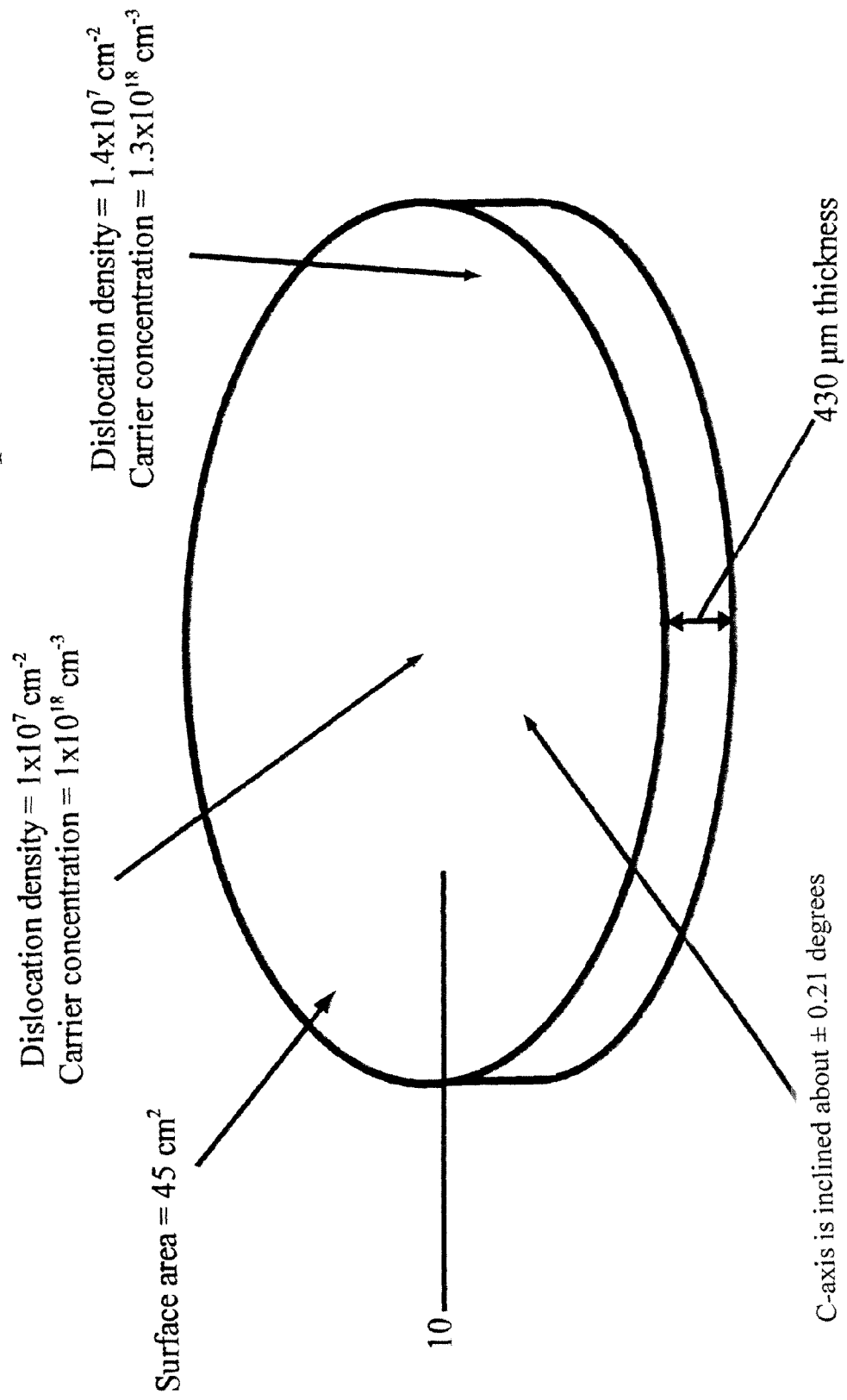
FIG. 1F – Inventive Example 1

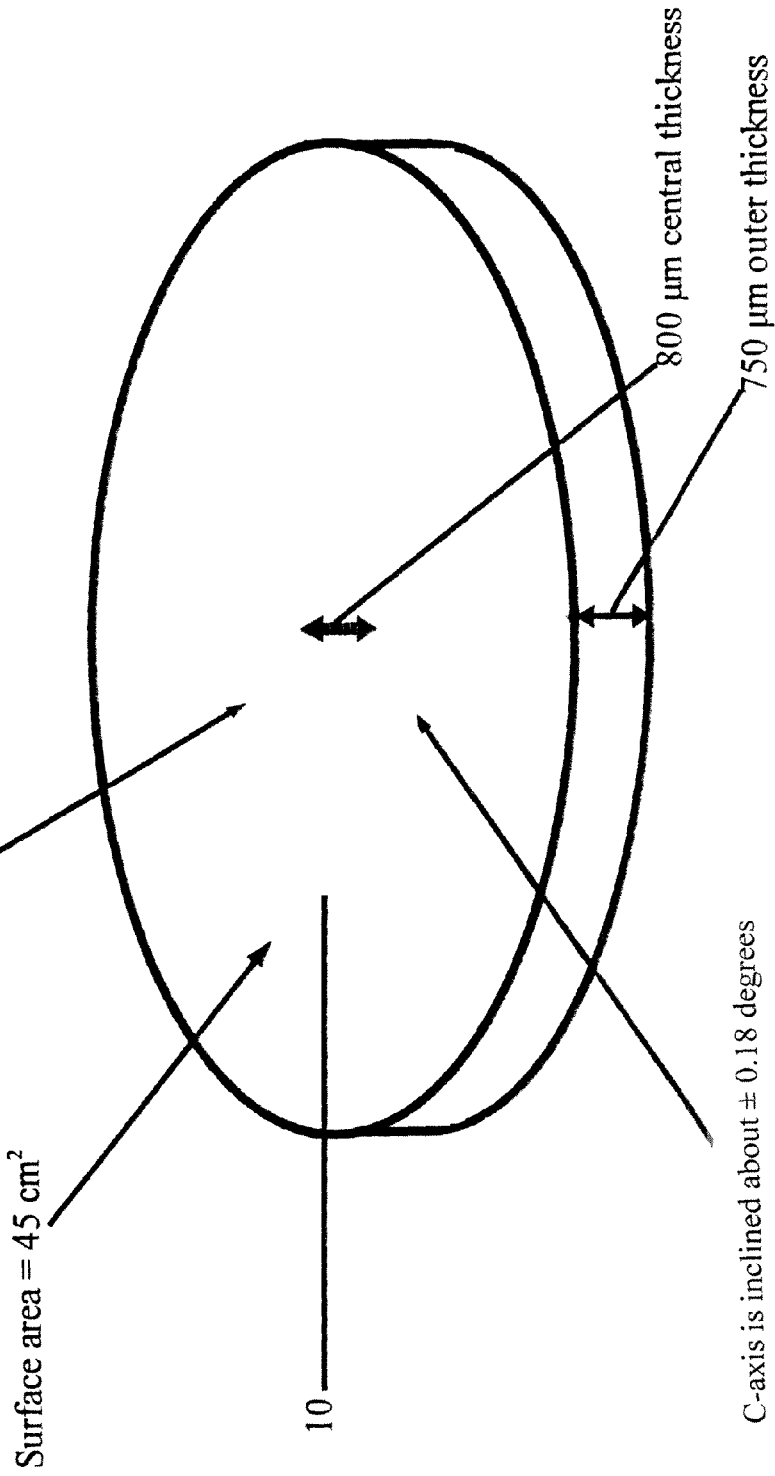

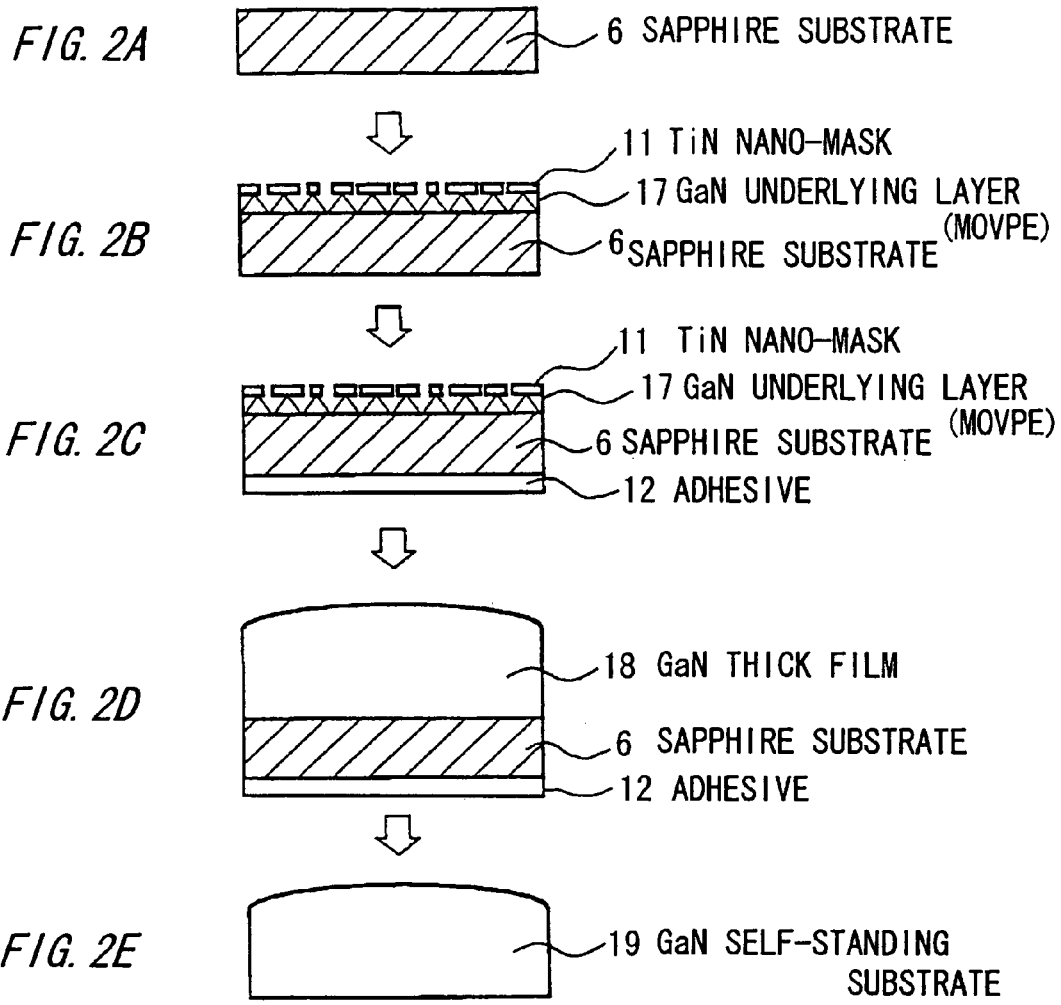

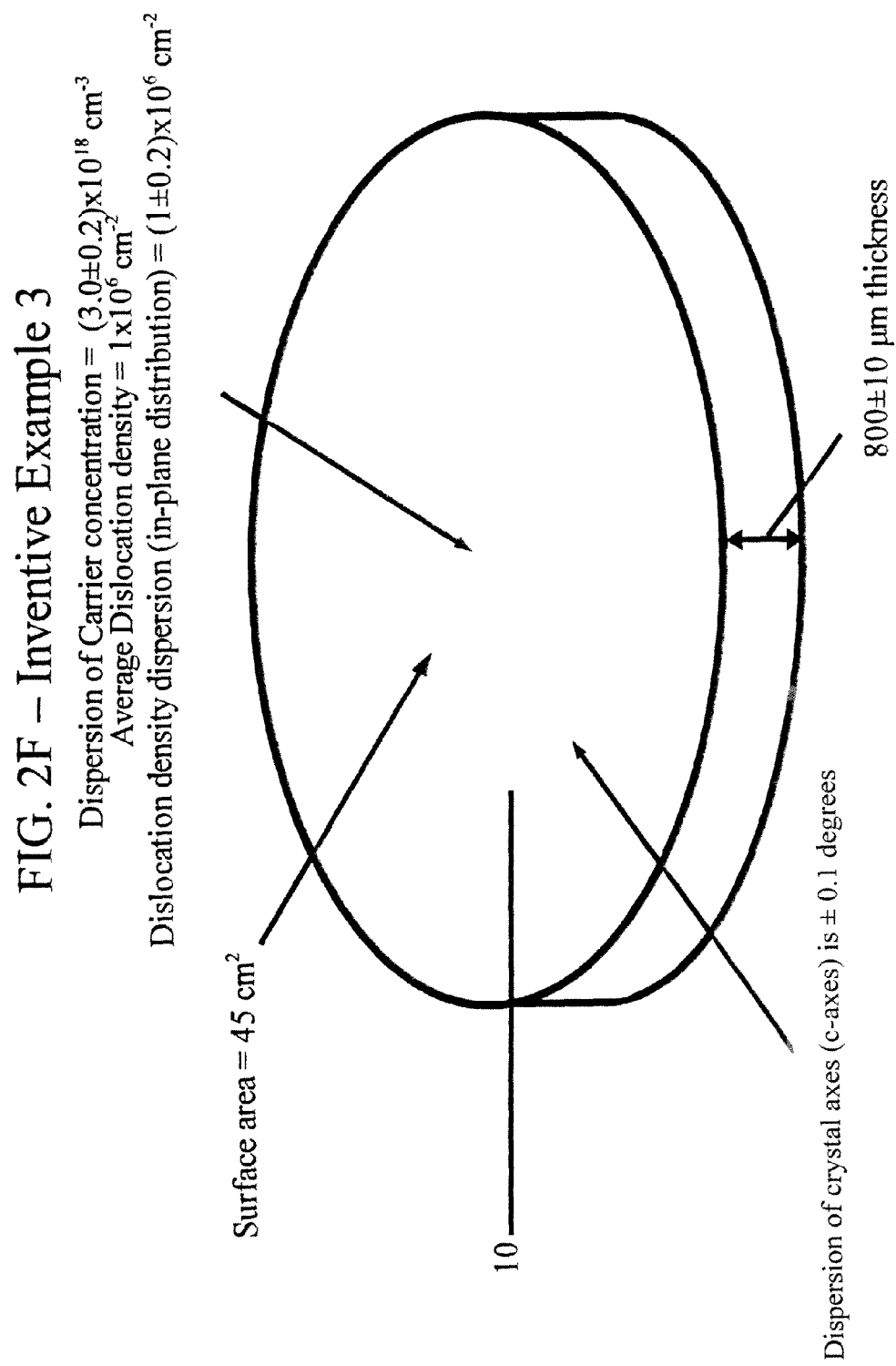
FIG. 2F – Inventive Example 3
Dispersion of Carrier concentration = $(3.0\pm0.2)\times10^{18}$ cm$^{-3}$
Average Dislocation density = $1\times10^{6}$ cm$^{-2}$
Dislocation density dispersion (in-plane distribution) = $(1\pm0.2)\times10^{6}$ cm$^{-2}$
Surface area = 45 cm$^2$
800±10 µm thickness
Dispersion of crystal axes (c-axes) is ± 0.1 degrees

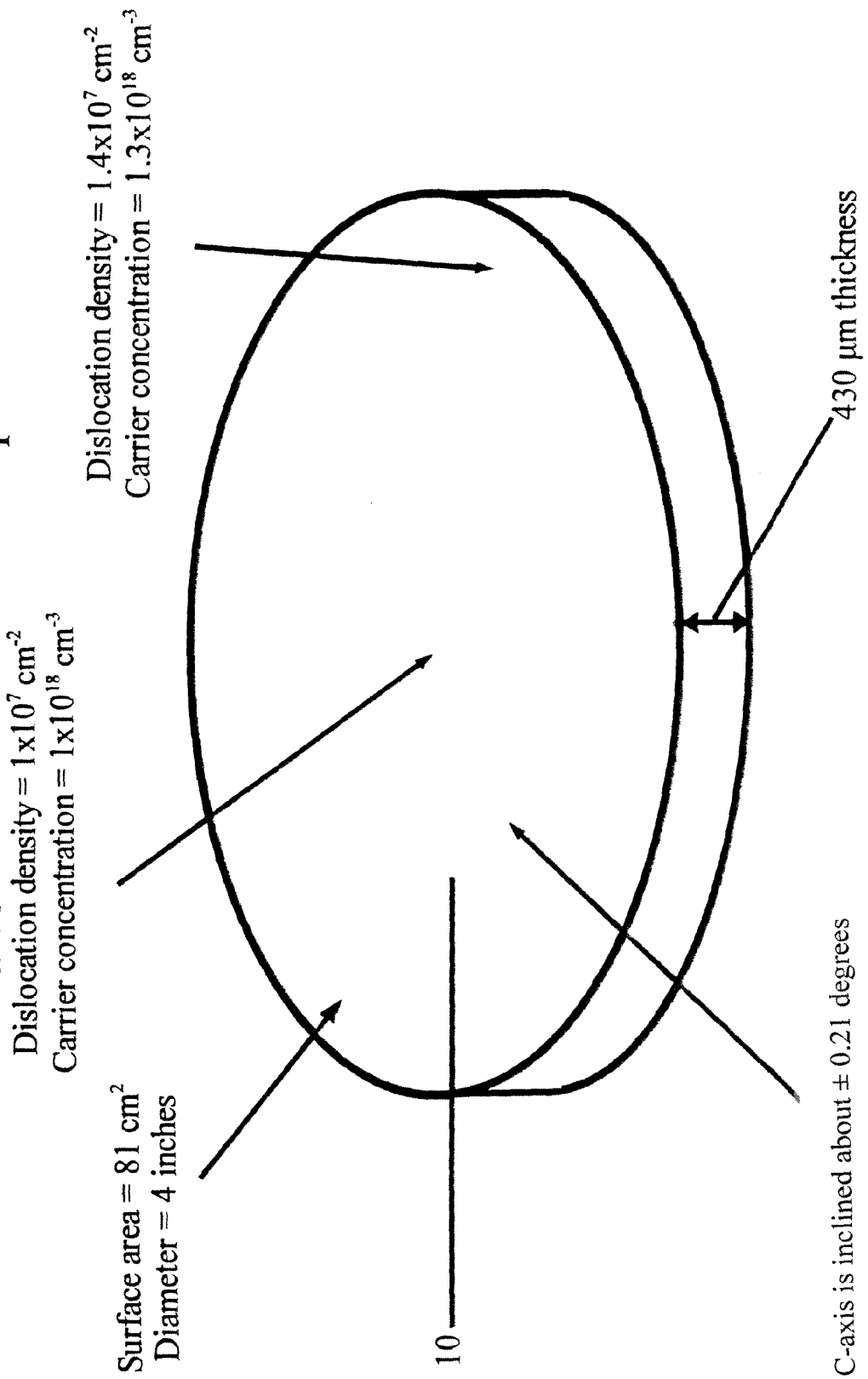
FIG. 2G – Inventive Example 4
Dislocation density = $1 \times 10^7$ cm$^{-2}$
Carrier concentration = $1 \times 10^{18}$ cm$^{-3}$
Dislocation density = $1.4 \times 10^7$ cm$^{-2}$
Carrier concentration = $1.3 \times 10^{18}$ cm$^{-3}$
430 μm thickness
Surface area = 81 cm$^2$
Diameter = 4 inches
C-axis is inclined about ± 0.21 degrees

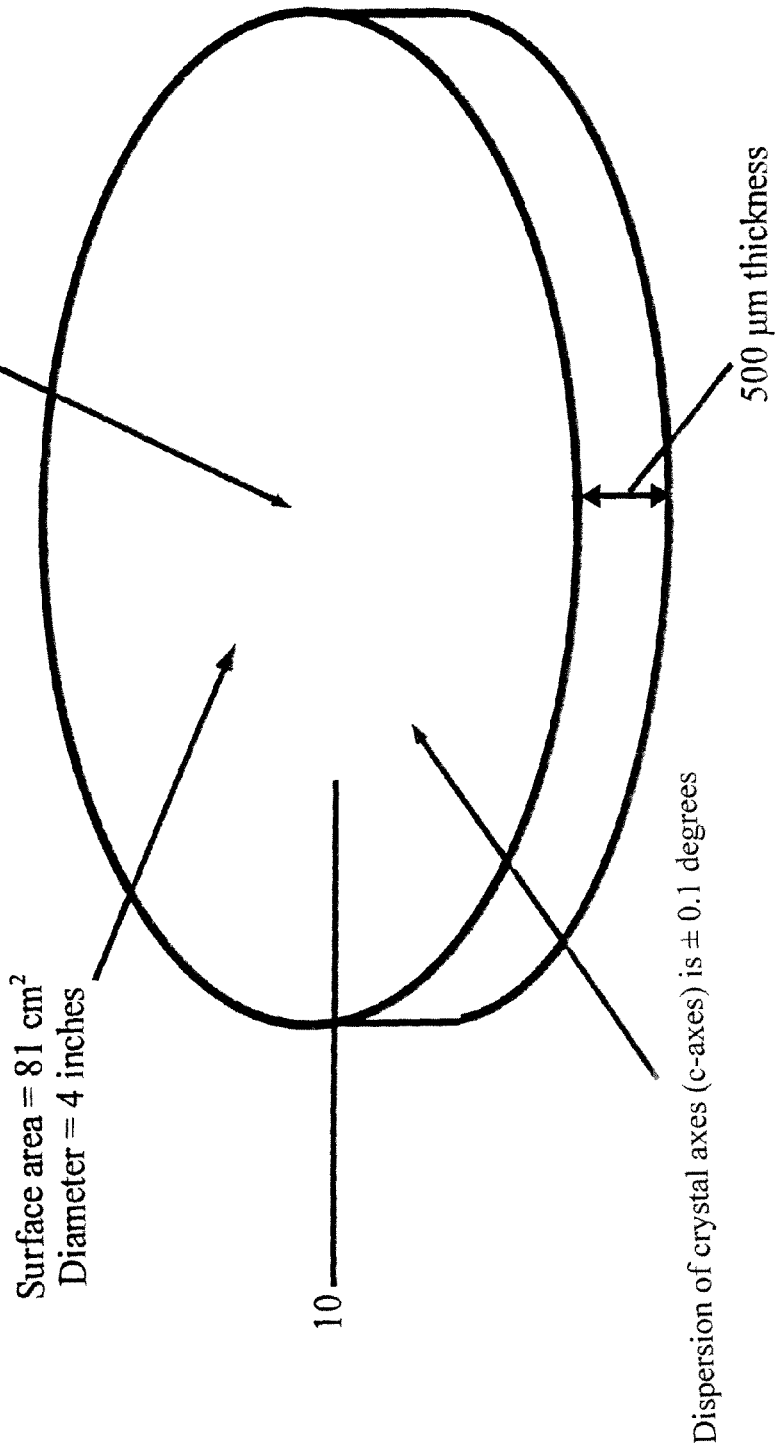
FIG. 2H – Inventive Example 5
Dispersion of Carrier concentration = $(3.0\pm0.2)\times10^{18}$ cm$^{-3}$
Average Dislocation density = $5\times10^5$ cm$^{-2}$
Dislocation density dispersion (in-plane distribution) = $(5\pm0.2)\times10^5$ cm$^{-2}$
Surface area = 81 cm$^2$
Diameter = 4 inches
500 μm thickness
Dispersion of crystal axes (c-axes) is ± 0.1 degrees

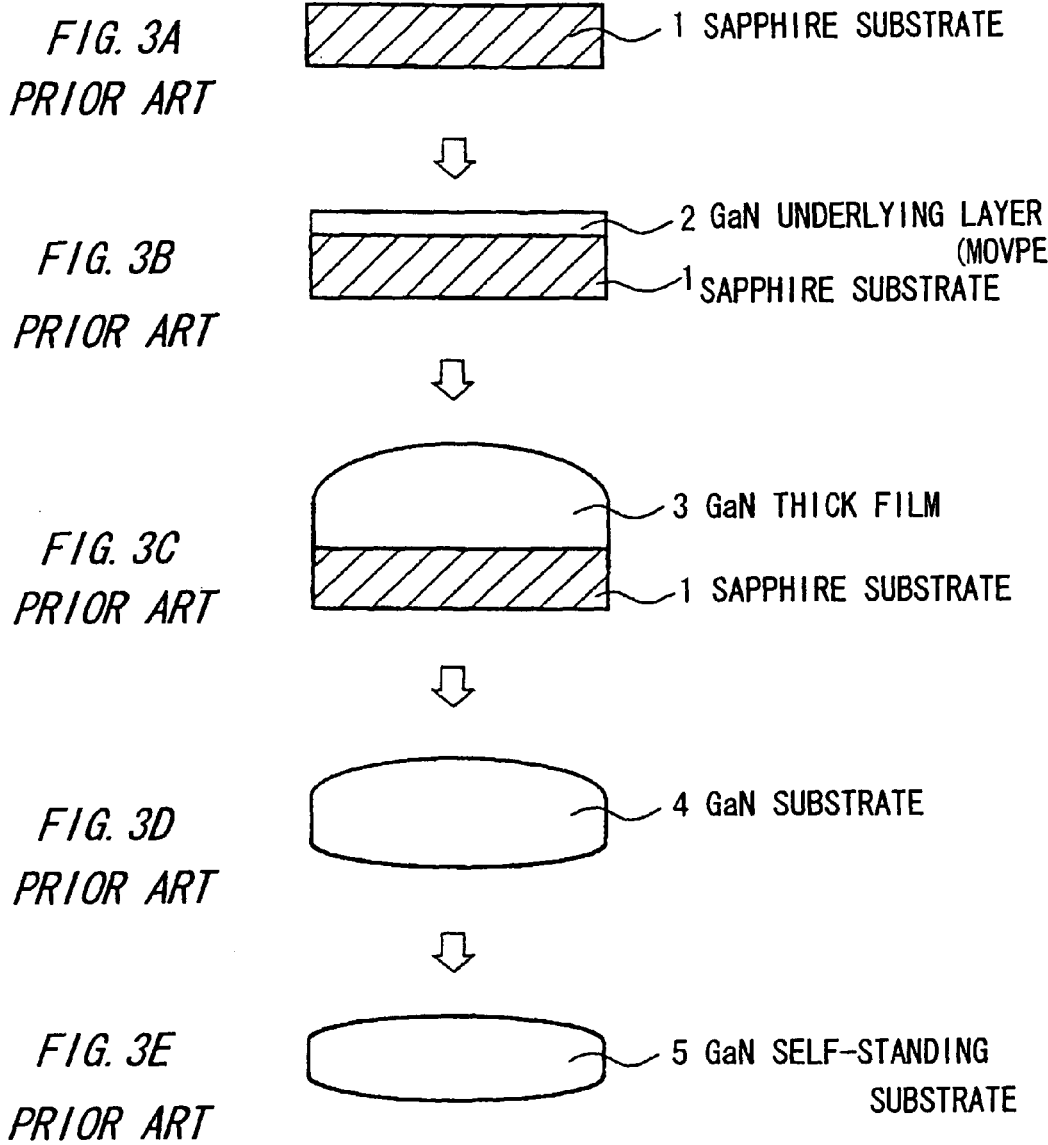

GROUP III-V NITRIDE BASED SEMICONDUCTOR SUBSTRATE AND METHOD OF MAKING SAME

CROSS-REFERENCE TO RELATED APPLICATIONS

The present application is a Continuation Application of U.S. patent application Ser. No. 11/176,687 filed on Jul. 8, 2005 now abandoned. The present application is based on and claims priority to Japanese patent application No. 2005-113416 filed on Apr. 11, 2005, the entire contents of which are incorporated herein by reference.

BACKGROUND OF THE INVENTION

1. Field of the Invention

This invention relates to a group III-V nitride-based semiconductor substrate and a method of making the same.

2. Description of the Related Art

GaN-based compound semiconductors such as gallium nitride (GaN), indium gallium nitride (InGaN) and aluminum gallium nitride (AlGaN) attract attention for a material of blue light emitting diode (LED) or laser diode (LD). Further, since the GaN-based compound semiconductors have a good heat resistance and environment resistance, they have begun to be applied to other electronic devices.

At present, a substrate used widely to grow GaN is sapphire. In general, a method is used in which GaN is epitaxially grown on a sapphire single crystal substrate by MOVPE (metalorganic vapor phase epitaxy) etc.

However, since the sapphire substrate mismatches in lattice constant with the GaN, a GaN single crystal cannot be grown directly on the sapphire substrate. Therefore, a method is disclosed in which a buffer layer (=low-temperature growth buffer layer) of AlN or GaN is grown on the sapphire substrate at a low temperature to buffer strain in lattice and then GaN is grown thereon (e.g., Japanese patent Nos. 3026087 and 2751963 and Japanese patent publication No. 8-8217).

By using the low-temperature growth buffer layer, the epitaxial growth of GaN single crystal can be realized. However, the above method still has a problem that the grown GaN has a number of defects since the lattice mismatch between the substrate and the GaN is not eliminated. It is presumed that the defect brings some failure to a manufacture of GaN-based LD.

Under the circumstances, it is desired to develop a GaN self-standing substrate. Since it is difficult to grow a large ingot of GaN from melt unlike Si or GaAs, various methods such as the ultrahigh temperature and pressure method, flux method and HVPE (hydride vapor phase epitaxy) have been tried to make the GaN self-standing substrate.

A typical method for making a nitride semiconductor self-standing substrate is conducted such that a GaN thick film is grown on a hetero-substrate such as sapphire by HVPE and then the hetero-substrate is removed to obtain a GaN self-standing substrate (e.g., JP-A-2003-178984, herein referred to as VAS method and the entire contents of JP-A-2003-178984 are incorporated herein by reference). In this method, a void-containing layer functions as a strain buffering layer so as to buffer a strain caused by a difference in lattice constant or thermal expansion coefficient between the underlying substrate and the group III nitride semiconductor layer grown thereon. By the method, a substrate of group III nitride semiconductor can be obtained which offers a reduced defect density and a good crystalline quality without warping. Further, the self-standing substrate thus obtained can be easily separated. Based on the method, GaN substrates with a reduced dislocation have begun to be commercially available.

However, a large practical GaN single crystal with a high crystalline quality has never been developed even in the above methods.

In the ultrahigh temperature and pressure method, which needs tens of thousands of atmospheres and thousands of degrees, it is difficult to grow a large crystal. Therefore, it only can provide a GaN crystal with a diameter of several millimeters and a thickness of several tens of millimeters.

In the flux method, although it only needs hundreds of atmospheres and about a thousand degrees, it only can provide a GaN crystal with a diameter of several millimeters and a thickness of several tens of micrometers. In addition, there are problems that removal of nitrogen occurs and Na or Ca flux is diffused into the crystal. Furthermore, since it is difficult to control the generation of crystal nuclei at initial growth, polycrystal may be contained.

In the HVPE method, a crystal with a diameter of about 5.08 cm(=2 inches) has been developed. However, in view of economical aspect of device fabrication, a lager wafer of GaN single crystal is desired with a diameter of 7.62 cm(=3 inches) or more. In fabricating such a large wafer, there is a problem that in-plane properties thereof become significantly non-uniform and thereby the large area becomes meaningless. For example, the non-uniformity of dislocation density may cause dispersion in reliability of each device. The non-uniformity of electrical resistivity (carrier concentration) may cause dispersion in operating voltage. The non-uniformity of crystal orientation may cause dispersion in emission wavelength since the InGaN composition of an active layer may be non-uniform. The non-uniformity of thickness, especially unevenness on the back surface face of the substrate causes non-uniformity of temperature distribution during growth of device epitaxial layer. This affects the InGaN composition of the active layer to cause non-uniformity in the emission wavelength.

SUMMARY OF THE INVENTION

It is an exemplary aspect of the invention to provide a group III-V nitride-based semiconductor substrate and a method of the same that can offer an improved uniformity in in-plane property.

(I) According to one aspect of the invention (e.g., see FIG. 4), a group III-V nitride-based semiconductor substrate 10 comprises:

a group III-V nitride-based semiconductor crystal;

wherein the substrate has a surface area of 45 cm$^2$ or more, the substrate has thickness of 200 μm or more, the substrate has an in-plane dislocation density of 2×10$^7$ cm$^{-2}$ or less in average, and the in-plane dislocation density is 150% or less of the average at maximum.

A. In an exemplary embodiment, the substrate has at a surface thereof a dispersion in crystal axis of ±0.3 degrees or less.

B. In an exemplary embodiment, the substrate has at an arbitrary point of a surface thereof a carrier concentration that falls within ±20% of an average carrier concentration at the surface.

C. In an exemplary embodiment, the substrate has at an arbitrary point of a surface thereof a thickness that falls within ±10 μm from an average thickness at the surface.

D. In an exemplary embodiment, the group III-V nitride-based semiconductor crystal has an FWHM value of X-ray rocking curve of 250 seconds or less.

E. In an exemplary embodiment, the group III-V nitride-based semiconductor crystal has a composition of $In_xAl_yGa_{1-x-y}N$ ($x \geqq 0$, $y \geqq 0$, $x+y \leqq 1$).

(II) According to another aspect of the invention, a method of making a group III-V nitride-based semiconductor substrate comprises:

providing a first crystal substrate;

placing the first crystal substrate on a susceptor;

holding down the first crystal substrate on the susceptor; and growing a first group III-V nitride-based semiconductor crystal on the first crystal substrate.

A. In an exemplary embodiment, the first crystal substrate is bonded to the susceptor.

B. In an exemplary embodiment, the first crystal substrate is a hetero-substrate that has a composition different from the first group III-V nitride-based semiconductor crystal.

C. In an exemplary embodiment, the first crystal substrate is a hetero-substrate that has a composition different from the first group III-V nitride-based semiconductor crystal, and the method further including:

growing a second group III-V nitride-based semiconductor crystal on the hetero-substrate, providing the second group III-V nitride-based semiconductor crystal with a void;

growing a third group III-V nitride-based semiconductor crystal on the second group III-V nitride-based semiconductor crystal provided with the void;

removing the hetero-substrate and the second group III-V nitride-based semiconductor crystal to have the third group III-V nitride-based semiconductor crystal that corresponds to the first group III-V nitride-based semiconductor crystal.

D. In an exemplary embodiment, the hetero-substrate is a sapphire substrate.

E. In an exemplary embodiment, the first crystal substrate is a seed crystal substrate that has the same composition as the first group III-V nitride-based semiconductor crystal.

F. In an exemplary embodiment, the first group III-V nitride-based semiconductor crystal has a composition of $In_xAl_yGa_{1-x-y}N$ ($x \geqq 0$, $y \geqq 0$, $x+y \leqq 1$).

(III) According to another aspect of the invention, a method of making a group III-V nitride-based semiconductor substrate comprises:

providing a first crystal substrate;

placing the first crystal substrate on a susceptor;

holding down the first crystal substrate on the susceptor to allow exposition of a part of an opposite surface of the first crystal substrate to a surface of the first crystal substrate that faces the susceptor; and growing a first group III-V nitride-based semiconductor crystal on the exposed opposite surface of the first crystal substrate.

A. In an exemplary embodiment, the first crystal substrate is bonded to the susceptor.

B. In an exemplary embodiment, the first crystal substrate is a hetero-substrate that has a composition different from the first group III-V nitride-based semiconductor crystal.

C. In an exemplary embodiment, the first crystal substrate is a hetero-substrate that has a composition different from the first group III-V nitride-based semiconductor crystal, and the method further including:

growing a second group III-V nitride-based semiconductor crystal on the hetero-substrate, providing the second group III-V nitride-based semiconductor crystal with a void;

growing a third group III-V nitride-based semiconductor crystal on the second group III-V nitride-based semiconductor crystal provided with the void;

removing the hetero-substrate and the second group III-V nitride-based semiconductor crystal to have the third group III-V nitride-based semiconductor crystal that corresponds to the first group III-V nitride-based semiconductor crystal.

D. In an exemplary embodiment, the hetero-substrate is a sapphire substrate.

E. In an exemplary embodiment, the first crystal substrate is a seed crystal substrate that has the same composition as the first group III-V nitride-based semiconductor crystal.

F. In an exemplary embodiment, the first group III-V nitride-based semiconductor crystal has a composition of $In_xAl_yGa_{1-x-y}N$ ($x \geqq 0$, $y \geqq 0$, $x+y \leqq 1$).

Solutions of the Invention

The invention is featured in that, in the growth of nitride semiconductor by HVPE (hydride vapor phase epitaxy), temperature of crystal during the growth is kept uniform to make the growth speed and impurity concentration uniform. Thereby, various properties such as dislocation density to be varied therewith can be significantly enhanced.

As the result of many researches, it is found by the inventor that the in-plane non-uniformity described earlier is basically caused by non-uniformity in growth temperature.

First, the non-uniformity in growth temperature causes non-uniformity in growth speed. The hetero-epitaxial growth of GaN proceeds generally in the Volmer-Weber type growth manner, wherein a number of growth initial nuclei are generated, they are bonded to each other as the growth progresses, and it is finally transited into two-dimensional growth. If the growth speed is varied, a nucleus generation density at initial growth and the subsequent planarization behavior are varied and, thereby, a dislocation density at final surface is varied. Furthermore, if the growth speed is varied, a dopant introduction density is also varied, which causes non-uniformity in carrier concentration and electrical resistivity. In addition, although a GaN crystal after growth is generally polished at both faces thereof to be used for a wafer, the in-plane polishing speed may be non-uniform due to a difference in dislocation density or carrier concentration and, thereby, the final thickness may be non-uniform.

Second, the non-uniformity in growth temperature causes a warp in crystal. Thereby, the in-plane dispersion of crystal axes may be increased.

Accordingly, it is important to keep the growth temperature uniform so as to have a uniform property in large-diameter substrate. In general, the crystal growth of GaN is conducted placing a seed substrate on a black-body susceptor of graphite or SiC. Since the GaN or sapphire has a transparent body, the heating of substrate is conducted mainly by thermal conduction through the susceptor. Thus, it is important to keep the substrate uniformly in contact with the susceptor.

As described above, it is very necessary that a flat substrate is placed on a flat susceptor to secure a sufficient thermal contact therebetween. However, it is found by the inventor that, in hetero-epitaxial growth of a thick film as thick as several hundreds of micrometers, different from general homo-epitaxial growth or hetero-epitaxial growth of a thin film, the substrate is significantly warped during growth and the thermal contact therebetween may be therefore non-uniform. Namely, the growth of GaN on a hetero-epitaxial substrate such as sapphire, as described earlier, proceeds generally in the Volmer-Weber type growth manner, where the initial growth nucleus attract each other so as to minimize the surface energy when being combined each together and, as a result, a tensile stress must be generated. It does not matter when the thickness of the growth film is sufficiently thin as compared to the thickness of the underlying substrate. However, when the thickness of the growth film is equal to or greater than the underlying substrate, a large warping is generated such that it can seriously affect the thermal distribution of the in-plane growth substrate.

Solutions to these problems made by the inventor are as follows.

(a) The underlying substrate is to be bonded to the susceptor. For example, alumina-based high-temperature adhesives can be used such that a sufficient adhesion force is applied therebetween even at a high temperature of higher than 1000° C.

(b) The underlying substrate is to be mechanically held down on the susceptor. For example, a ring-shaped jig can be used such that the underlying substrate is secured to the susceptor through a screw so as to grow a crystal in an opening region except the jig.

(c) The underlying substrate is to have an increased thickness. Thereby, its rigidity can be enhanced to prevent the deformation by a stress.

(d) An opaque body is to be disposed under the underlying substrate. For example, a carbon thin layer is coated on the bottom face of the underlying substrate. Thereby, even when the underlying substrate locally gets away from the susceptor, the reduction of temperature can be prevented at that portion.

By suitably combining any of the above solutions, the following large-size substrate can be obtained with a high uniformity. In detail, a group III-V nitride semiconductor substrate with a diameter of 7.62 cm (=3 inches) (or with an equivalent surface area of 45 $cm^2$) and with a thickness of 200 μm or more to allow a sufficient rigidity to prevent the breaking in the handling process, wherein:

(A) its dislocation density is $2 \times 10^7$ $cm^{-2}$ or less in average and its maximum value is 150% or less of the average value;

(B) its in-plane dispersion of c-axis (i.e., an angle defined by a main plane and c-axis) is ±3.0 degrees or less;

(C) its in-plane dispersion of electrical resistivity (i.e., carrier concentration) is ±20% or less of an average value; and (D) its in-plane dispersion of thickness is ±10 μm or less of an average value.

Using a substrate of the invention, a device epitaxial layer with a large surface area can be fabricated in a high uniformity. Therefore, it is very advantageous in economical aspect. Thus, in the invention, the in-plane non-uniformity of the substrate properties caused by the non-uniformity of the growth temperature can be eliminated. Thereby, a group III-V nitride semiconductor substrate can be obtained with a high quality and a high uniformity.

BRIEF DESCRIPTION OF THE DRAWINGS

The exemplary embodiments according to the invention will be explained below referring to the drawing, wherein:

FIGS. 1A to 1G are illustrative cross sectional views showing of a method of making a group III-V nitride semiconductor substrate in a first exemplary embodiment according to the invention and the subsequently obtained properties thereof (e.g. Inventive Examples 1 and 2);

FIGS. 2A to 2H are illustrative cross sectional views showing of a method of making a group III-V nitride semiconductor substrate in a second exemplary embodiment according to the invention and the subsequently obtained properties thereof (e.g. Inventive Examples 3-5);

FIGS. 3A to 3E are illustrative cross sectional views showing a conventional method of making a group III-V nitride semiconductor substrate.

DETAILED DESCRIPTION OF THE EXEMPLARY EMBODIMENTS

CONVENTIONAL EXAMPLE

Figure 1A:

Making 3-Inch Substrate by a Simple Template

For the sake of comparison, a conventional example will be first explained below referring to FIGS. 3A to 3E.

As shown in FIGS. 3A and 3B, a 300 nm thick GaN underlying layer 2 is formed on a c-face sapphire substrate with a diameter of 7.62 cm (=3 inches) and a thickness of 330 μm by MOVPE.

Then, it is placed in a HVPE furnace and a Si-doped GaN thick film 3 is grown (FIG. 3C). Carrier gas is $N_2:H_2=9:1$. Partial pressures are $GaCl=9 \times 10^{-3}$ atm, $NH_3=5 \times 10^{-2}$ atm. For n-type doping, $SiH_2Cl_2$ gas is flown at partial pressure of $5 \times 10^{-4}$ atm. Growth temperature is 1070° C.

The resultant GaN crystal (i.e., GaN thick film 3) has a thickness of 800 μm at the central portion and 500 μm at the outermost portion. Thus, it has a significant distribution in thickness.

By irradiating YAG laser from the backside of the sapphire substrate 1, a GaN substrate 4 is separated decomposing a GaN crystal at the interface (FIG. 3D). The GaN substrate 4 separated is warped in the form of a concave, whose curvature radius is about 3 meters. By polishing both faces of the GaN substrate 4, a 3-inch GaN self-standing substrate 5 with a thickness of 430 μm at the central portion is obtained (FIG. 3E). However, it has a highly reduced thickness of 400 μm at the outermost portion.

In evaluating the uniformity of the properties of the GaN substrate (i.e., GaN self-standing substrate 5), it is found that there is a significant in-plane distribution. Namely, the dislocation density is $2 \times 10^7$ $cm^{-2}$ at the outermost portion while it is $1 \times 10^7$ $cm^{-2}$ at the central portion. The carrier concentration is $3 \times 10^{18}$ $cm^{-3}$ at the outermost portion while it is $1 \times 10^{18}$ $cm^{-3}$ at the central portion. It is presumed that these distributions are caused by that the in-plane distribution of growth speed is large. That the polishing rate is faster at the outer portion of the substrate and the thickness of the outer portion is thus reduced may be affected by the non-uniformity of the dislocation density and the carrier concentration. Further, the c-axis is inclined as much as about ±0.7 to the center of the substrate. This inclination may be generated because of directly polishing the warped substrate.

Next, by using the GaN self-standing substrate 5, a blue LED is epitaxially grown by MOVPE. Its active layer is formed in multiquantum well structure of InGaN/AlGaN and is sandwiched by AlGaN cladding layers. The emission wavelength of the obtained LED is highly dispersed as 405±15 nm, and 90% of the entire area of the epitaxial wafer does not meet the standard. This is because the crystal orientation of the GaN substrate used is not uniform and, therefore, the composition of InGaN in the active layer is dispersed in plane. In the accelerated test of device life, about 10% of samples have a life less than 10000 hours in high output operation at 1 W. This may be caused by a local region with a high dislocation density.

INVENTIVE EXAMPLE 1

Preventing the Warping by a Thick Sapphire

FIGS. 1A to 1E are illustrative cross sectional views showing of a method of making a group III-V nitride semiconductor substrate in the first exemplary embodiment according to the invention.

Figure 1B:
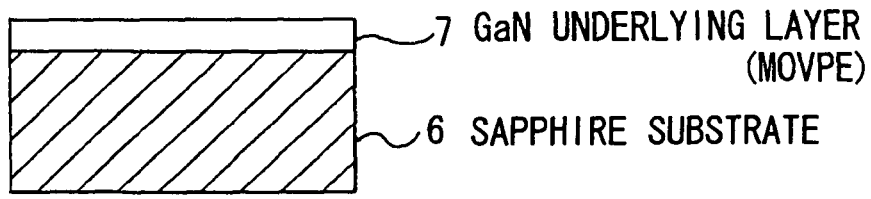

As shown in FIGS. 1A and 1B, a 300 nm thick GaN underlying layer 7 is formed on a c-face sapphire substrate 6 with a diameter of 7.62 cm(=3 inches) and a thickness of 650 µm by MOVPE.

Figure 1C:
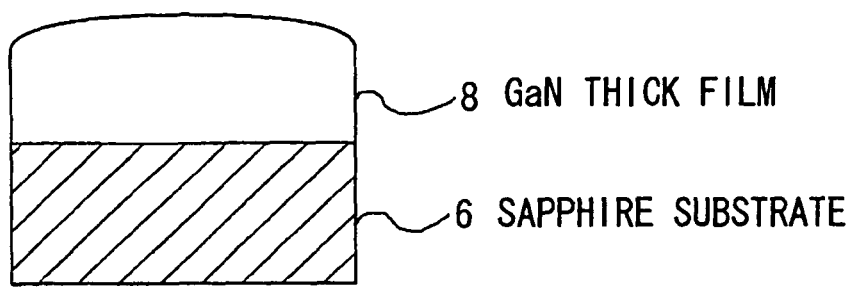

Then, like the conventional example, it is placed in a HVPE furnace and a Si-doped GaN thick film 8 is grown (FIG. 1C). Carrier gas is $N_2:H_2=1:1$. Partial pressures are $GaCl=9 \times 10^{-3}$ atm, $NH_3=1 \times 10^{-1}$ atm. For n-type doping, $SiH_2Cl_2$ gas is flown at partial pressure of $5 \times 10^{-4}$ atm. Growth temperature is 1070° C.

Figure 1D:
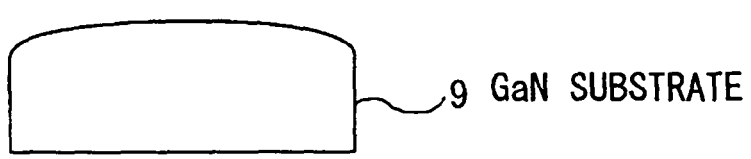

By irradiating YAG laser from the backside of the sapphire substrate 6, a GaN substrate 9 is separated decomposing a GaN crystal at the interface (FIG. 1D).

The resultant GaN crystal (i.e., GaN thick film 8) has a thickness of 800 µm at the central portion and 700 µm at the outermost portion. Thus, it has an improved distribution in thickness. The GaN substrate 9 separated has a curvature radius of about 10 meters, where the warping is significantly improved. This is because of using the thick sapphire substrate 6. The improvement of thickness distribution may be caused such that the warping during growth is reduced, the uniform contact with the susceptor (not shown) is thereby obtained and the growth temperature becomes uniform in plane.

Figure 1E:
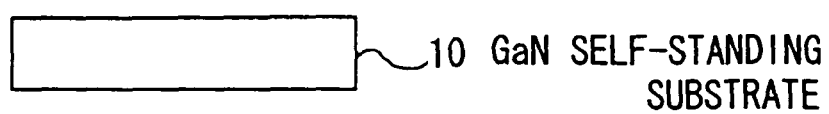
Figure 4:
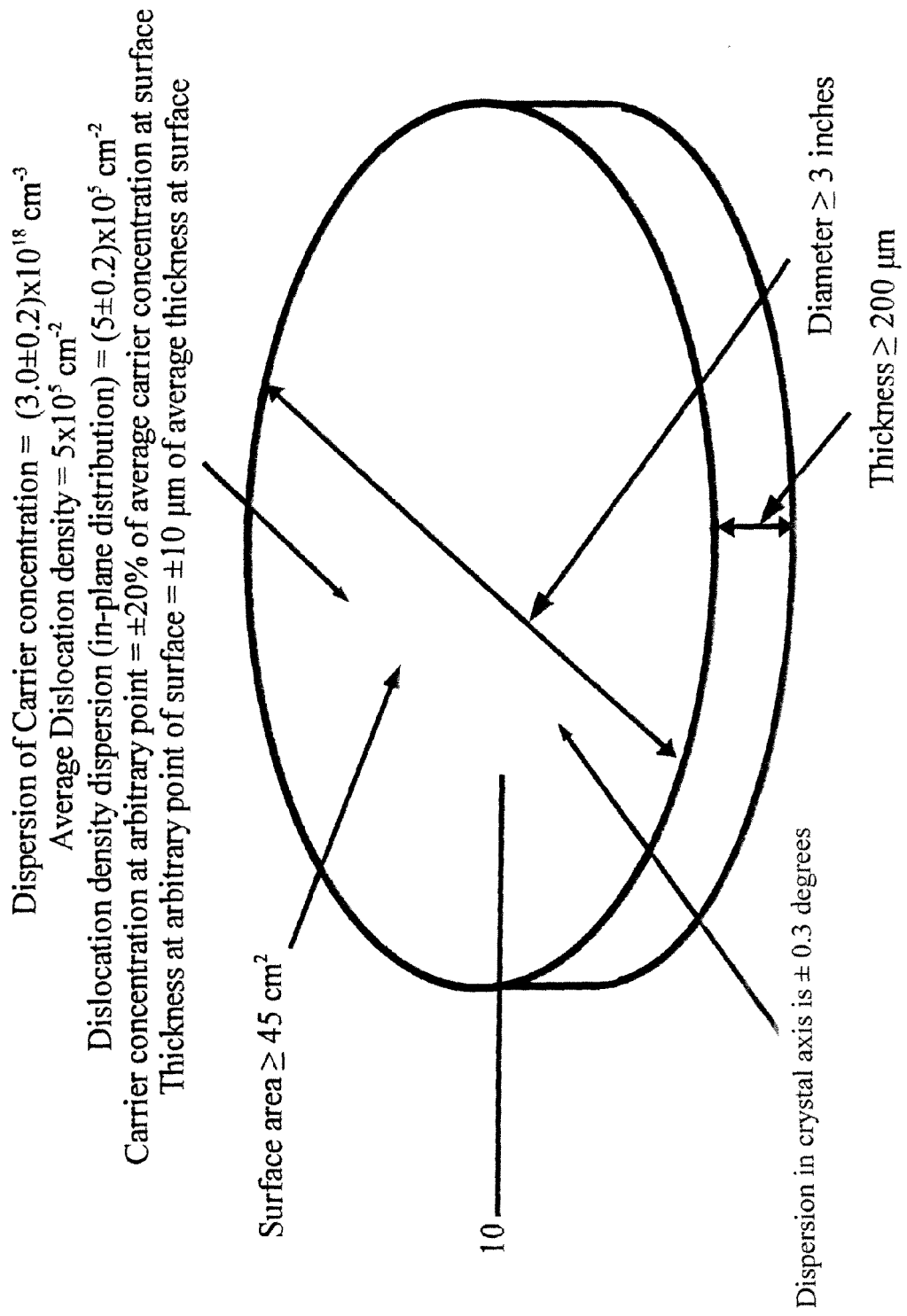
FIG. 4 is a plan view of an exemplary embodiment of an exemplary aspect of the invention.

Both faces of the GaN substrate 9 are polished (FIG. 1E). Because of the improved thickness distribution and warping, though it has a reduced growth thickness, by polishing both faces of the substrate, a 3-inch GaN self-standing substrate 10 with a uniform thickness of 430 µm can be obtained.

In evaluating the uniformity of the properties of the GaN substrate (i.e., GaN self-standing substrate 10 at FIG. 1F), it is found that there is a significant improvement. The dislocation density is $1.4 \times 10^7$ cm$^{-2}$ at the outermost portion while it is $1 \times 10^7$ cm$^{-2}$ at the central portion. At an arbitrary point of a surface of the substrate, a carrier concentration falls within ±20% of an average carrier concentration at the surface. The carrier concentration is $1.3 \times 10^{18}$ cm$^{-3}$ at the outermost portion of the substrate while it is $1 \times 10^{18}$ cm$^{-3}$ at the central portion of the substrate. Further, a dispersion in crystal axis of the surface of the substrate is ±0.3 degrees or less. In this exemplary embodiment of the invention, the c-axis is inclined about ±0.21.

INVENTIVE EXAMPLE 2

Further Enhancing the Uniformity by Coating Carbon on the Back Face of the Sapphire Substrate In the inventive example 1, an about 1 µm thick carbon layer is formed on the back face of the sapphire substrate 6 and then the HVPE growth is conducted in like manner. Thereby, the temperature distribution during growth can be further improved. As is shown in FIG. 1G, the thickness distribution as grown is 800 µm at the central portion and 750 µm at the outermost portion.

As is also shown in FIG. 1G, the properties of the GaN substrate are also improved. The dislocation density is $1 \times 10^7$ cm$^{-2}$ both at the central portion and at the outermost portion. At an arbitrary point of a surface of the substrate, a carrier concentration falls within ±20% of an average carrier concentration at the surface. The carrier concentration is $1 \times 10^{18}$ cm$^{-3}$ both at the central portion and at the outermost portion. Further, a dispersion in crystal axis of the surface of the substrate is ±0.3 degrees or less. In this exemplary embodiment of the invention, the c-axis is inclined about ±0.18 degrees.

INVENTIVE EXAMPLE 3

Bonding the Sapphire Substrate to the Susceptor+VAS Method

FIGS. 2A to 2E are illustrative cross sectional views showing of a method of making a group III-V nitride semiconductor substrate in the third exemplary embodiment according to the invention.

As shown in FIG. 2A, a c-face sapphire substrate 6 with a diameter of 7.62 cm(=3 inches) and a thickness of 330 µm is provided.

Then, a 300 nm thick GaN thin film(=GaN under lying layer 17) is formed on the sapphire substrate 6. Then, a 20 nm thick Ti layer is formed thereon in vacuum deposition. Then, it is thermally treated in carrier gas of $H_2:NH_3=4:1$ at 1060° C. for 30 min. Thereby, the Ti layer is nitrided into a TiN layer and formed into mesh-like structure (i.e., TiN nano-mask 11) with a number of fine holes of tens of nanometers. On the other hand, the GaN underlying layer 17 is etched to have therein voids reaching up to the sapphire substrate 6 (FIG. 2B).

Then, the void-formed substrate is placed in the HVPE furnace while being bonded through an alumina-based high-temperature adhesive 12 to the graphite susceptor (not shown) (FIG. 2C).

Then, a 800 µm thick GaN thick film 18 is grown thereon by HVPE (FIG. 2D). Source gases for growth are $NH_3$ and GaCl, and partial pressures are $GaCl=8 \times 10^{-3}$ atm, $NH_3=8 \times 10^{-2}$ atm. The growth pressure and temperature are atmospheric pressure and 1040° C. For n-type doping, $SiH_2Cl_2$ gas is flown at partial pressure of $5 \times 10^{-4}$ atm.

In a cooling process after completing the growth, the GaN thick film 18 is by itself separated and a GaN self-standing substrate 19 with a diameter of 3 inches is obtained (FIG. 2E). As is shown in FIG. 2F, the thickness distribution of the GaN substrate 19 is well uniform as 800±10 µm.

In measuring the dislocation density of the GaN substrate 19 by cathode luminescence, as is also shown in FIG. 2F, a very small value is measured $1 \times 10^6$ cm$^{-2}$ in average. The dispersion (in-plane distribution) is also well uniform as $1 \pm 0.2 \times 10^6$ cm$^{-2}$. The FWHM value of X-ray rocking curve is 40 sec. for (0002) reflection. This evidences the low dislocation density. Further, at a surface of the substrate, a dispersion in crystal axis of ±0.3 degrees or less, and, at an arbitrary point of the surface of the substrate, a carrier concentration falls within ±20% of an average carrier concentration at the surface. In this exemplary embodiment of the invention, the dispersion of crystal axes (c-axes) is ±0.1 degrees and the dispersion of carrier concentrations is $(3.0\pm0.2)\times10^{18}$ cm$^{-3}$. Thus, it is found that all the main properties are well uniform.

INVENTIVE EXAMPLE 4

Holding Down the Sapphire Substrate on the Susceptor+VAS Method

Like the inventive example 3, a void-formed substrate (FIG. 2B) with a diameter of 4.5 inches is fabricated. The substrate is placed in the HVPE furnace while being held down on the susceptor by using a ring-shaped jig to remedy the warping. Then, GaN is grown thereon like the inventive example 1 and, after the self-separation in the cooling process, a GaN substrate with a diameter of 4 inches is obtained, as is shown in FIG. 2G. The GaN substrate obtained has high and uniform properties like the inventive example 1.

INVENTIVE EXAMPLE 5

Bulk Growth by a GaN Seed Crystal with a Good Distribution

The GaN substrate obtained in the inventive example 3 is used as a seed crystal to grow a 40 mm long GaN ingot. Although the diameter is slightly increased in the process of growth, a transparent single crystal ingot with no crack can be obtained by grinding into a circular column with a diameter of 4 inches.

The position of (1-100) face is determined by X-ray diffraction, and a 15 mm long orientation flat is thereby formed. In order to identify a side of the substrate after slicing, a 10 mm long second orientation flat is formed at a position rotated by 90 degrees. Then, it is sliced by a wire saw to have 40 GaN substrates with a thickness of 500 μm, as is shown in FIG. 2H. Each of the substrates is mirror-polished at both faces thereof to get a transparent GaN single crystal substrate with a diameter of 4 inches.

As is also shown in FIG. 2H, in measuring the dislocation density of the GaN substrate by cathode luminescence, a very small value is measured $5\times10^5$ cm$^{-2}$ in average. The dispersion (in-plane distribution) is also well uniform as $5\pm0.2\times10^5$ cm$^{-2}$. The FWHM value of X-ray rocking curve is 30 sec. for (0002) reflection. This evidences the low dislocation density. Further, at a surface of the substrate, a dispersion in crystal axis of ±0.3 degrees or less, and, at an arbitrary point of the surface of the substrate, a carrier concentration falls within ±20% of an average carrier concentration at the surface. In this exemplary embodiment of the invention, the dispersion of crystal axes (c-axes) is ±0.1 degrees and the dispersion of carrier concentrations is $(3.0\pm0.2)\times10^{18}$ cm$^{-3}$. Thus, it is found that all the main properties are well uniform.

COMPARATIVE EXAMPLE

Bulk Growth by a GaN Substrate with a Bad Distribution

Like the conventional example, a GaN substrate with a diameter of 3 inches is provided. Then, a 40 mm long GaN ingot is grown thereon like the inventive example 5. Although the diameter is slightly increased in the process of growth, a transparent single crystal ingot can be obtained by grinding into a circular column with a diameter of 3 inches. However, it is found that a number of fine cracks are generated at a growth portion longer than 20 mm. This may be caused by that the crystal orientation distribution of the seed substrate is large and a large compression stress is applied during growth.

The position of (1-100) face is determined by X-ray diffraction, and a 15 mm long orientation flat is thereby formed. In order to identify a side of the substrate after slicing, a 10 mm long second orientation flat is formed at a position rotated by 90 degrees. Then, it is sliced by a wire saw to have 20 GaN substrates with a thickness of 500 μm. Each of the substrates is mirror-polished at both faces thereof to get a transparent GaN single crystal substrate with a diameter of 3 inches.

In measuring the dislocation density of the GaN substrate by cathode luminescence, a good value is measured $1\times10^6$ cm$^{-2}$ in average. However, an insufficient value is also measured about $1\times10^7$ cm$^{-2}$ depending on the in-plane position. Further, the dispersion of crystal axes (c-axes) is as large as ±0.4 degrees.

INVENTIVE EXAMPLE 6

By using a GaN substrate obtained in the inventive example 5, a blue LED epitaxial wafer is fabricated by MOVPE. The wafer is diced out into a number of LED's. Its active layer is formed in multiquantum well structure of InGaN/AlGaN and is sandwiched by AlGaN cladding layers.

The emission wavelength of the obtained LED's has a sufficient uniformity as 405±3 nm. Thus, 90% or more of the entire area of the epitaxial wafer meet the standard. This is because the crystal orientation of the GaN substrate used is uniform and, therefore, the composition of InGaN in the active layer is kept uniform in plane.

In the accelerated test of device life, all samples have a life more than 100,000 hours in high output operation at 1 W.

Other Application and Modification of the Invention

Although in the above embodiments the invention is applied to a method of making a GaN substrate, the invention can be also applied to a method of making a self-standing substrate of a ternary single crystal such as aluminum gallium nitride (AlGaN) and gallium indium nitride (GaInN) or a method of making a p-type GaN substrate doped with Mg etc.

Further, the invention can be applied not only to a manufacture of a self-standing substrate but also to a manufacture of a substrate with a hetero-substrate such as sapphire.

The group III nitride-based compound semiconductor substrate obtained by the invention can be widely used as a substrate for GaN-based devices. Especially, when it is used as a substrate for a laser diode, the laser diode can have a high performance and a high reliability since a good GaN-based crystal can be formed thereon with a reduced crystal defect.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A group III-V nitride-based semiconductor substrate, comprising:
 a group III-V nitride-based semiconductor crystal, wherein a surface area of said substrate is greater than or equal to 45 cm$^2$,
 wherein a thickness of said substrate is greater than or equal to 200 μm,
 wherein an in-plane dislocation density of said substrate is less than or equal to $2\times10^7$ cm$^{-2}$ in average,
 wherein said in-plane dislocation density of said substrate is less than or equal to 150% of the average at maximum, and wherein a dispersion of a crystal axis at a surface of said substrate is equal to or less than ±0.3 degrees.

2. A group III-V nitride-based semiconductor substrate, comprising:
a group III-V nitride-based semiconductor crystal,
wherein a surface area of said substrate is greater than or equal to 45 cm$^2$, wherein a thickness of said substrate is greater than or equal to 200 µm,
wherein an in-plane dislocation density of said substrate is less than or equal to $2\times10^7$ cm$^{-2}$ in average,
wherein said in-plane dislocation density of said substrate is less than or equal to 150% of the average at maximum, and
wherein a carrier concentration at an arbitrary point on a surface of said substrate is within a range of ±20% of an average carrier concentration at the surface.

3. The group III-V nitride-based semiconductor substrate according to claim 1, wherein a thickness at an arbitrary surface of said substrate is within a range of ±10 µm from an average thickness at the surface.

4. The group III-V nitride-based semiconductor substrate according to claim 1, wherein a diameter of said substrate is greater than or equal to 3 inches.

5. The group III-V nitride-based semiconductor substrate according to claim 1, wherein a carrier concentration at an arbitrary point of said substrate is within a range of ±20% of an average carrier concentration at a surface.

6. The group III-V nitride-based semiconductor substrate according to claim 5, wherein a full width at half maximum (FWHM) value of X-ray rocking curve of said group III-V nitride-based semiconductor crystal is less than or equal to 250 seconds.

7. The group III-V nitride-based semiconductor substrate according to claim 6, wherein a full width at half maximum (FWHM) value of X-ray rocking curve of said group III-V nitride-based semiconductor crystal is less than or equal to 40 seconds.

8. The group III-V nitride-based semiconductor substrate according to claim 7, wherein a full width at half maximum (FWHM) value of X-ray rocking curve of said group III-V nitride-based semiconductor crystal is less than or equal to 30 seconds.

9. The group III-V nitride-based semiconductor substrate according to claim 1, wherein said group III-V nitride-based semiconductor crystal comprises a composition of In$_x$Al$_{1-y}$Ga$_{1-x-y}$N (x≧0, y≧0, x+y≦1).

10. The group III-V nitride-based semiconductor substrate according to claim 9, wherein said group III-V nitride-based semiconductor crystal consists of a composition of In$_x$Al$_{1-y}$Ga$_{1-x-y}$N (x≧0, y≧0, x+y≦1).

11. The group III-V nitride-based semiconductor substrate according to claim 1, wherein the dispersion of the crystal axis is generated during growth of the semiconductor substrate.

12. The group III-V nitride-based semiconductor substrate according to claim 1, wherein the substrate is formed by the following process:
forming a group III-V nitride-based semiconductor underlying layer on a thick sapphire substrate;
growing a Si-doped group III-V nitride-based semiconductor thick film on the underlying layer; and
irradiating a laser from a backside of the sapphire substrate to separate the group III-V nitride-based semiconductor substrate from a remainder of the Si-doped group III-V nitride-based semiconductor thick film.

13. The group III-V nitride-based semiconductor substrate according to claim 12, wherein the forming of the underlying layer comprises forming the underlying layer on a c-face of the sapphire substrate by metal oxide vapor phase epitaxy (MOVPE), the sapphire substrate having a diameter of 7.62 cm and a thickness of 650 µm.

14. The group III-V nitride-based semiconductor substrate according to claim 12, further comprising:
forming a carbon layer on a back face of a sapphire substrate.

15. The group III-V nitride-based semiconductor substrate according to claim 1, wherein the substrate is formed by the following process:
forming a group III-V nitride-based semiconductor underlying layer on a sapphire substrate;
forming a titanium layer on the underlying layer;
bonding the sapphire substrate to a susceptor;
thermally treating the titanium layer to nitride the titanium layer and form a titanium nitride nano-mask on the underlying layer, and form voids in the underlying layer, the voids reaching the sapphire substrate;
growing a group III-V nitride-based semiconductor thick film on the titanium nitride nano-mask; and
cooling the group III-V nitride-based semiconductor thick film to separate the group III-V nitride-based semiconductor substrate from a remainder of the group III-V nitride-based semiconductor thick film.

16. The group III-V nitride-based semiconductor substrate according to claim 1, wherein the substrate is formed by the following process:
forming a group III-V nitride-based semiconductor underlying layer on a sapphire substrate;
forming a titanium layer on the underlying layer;
securing the sapphire substrate to a susceptor using a ring-shaped jig;
thermally treating the titanium layer to nitride the titanium layer and form a titanium nitride nano-mask on the underlying layer, and form voids in the underlying layer, the voids reaching the sapphire substrate;
growing a group III-V nitride-based semiconductor thick film on the titanium nitride nano-mask; and
cooling the group III-V nitride-based semiconductor thick film to separate the group III-V nitride-based semiconductor substrate from a remainder of the group III-V nitride-based semiconductor thick film.

17. A group III-V nitride-based semiconductor substrate, comprising:
a group III-V nitride-based semiconductor crystal, a surface area of said crystal being greater than or equal to 45 cm$^2$, a thickness of said crystal being greater than or equal to 200 µm, and an in-plane dislocation density of said crystal being less than or equal to $2\times10^7$ cm$^{-2}$ in average,
wherein the in-plane dislocation density of the crystal is substantially uniform at a central portion of the crystal and an outermost portion of the crystal, such that a maximum value of the in-plane dislocation density is less than or equal to 150% of an average value of the in-plane dislocation density, and
wherein a carrier concentration of the crystal is substantially uniform at a central portion of the crystal and an outermost portion of the crystal, such that a value of the carrier concentration at an arbitrary point on a surface of said crystal is within a range of ±20% of an average value of the carrier concentration at the surface.

* * * * *